United States Patent
Liu

(10) Patent No.: US 9,553,112 B2
(45) Date of Patent: Jan. 24, 2017

(54) ARRAY SUBSTRATE AND METHOD OF MANUFACTURING THE SAME, DISPLAY PANEL AND METHOD OF MANUFACTURING THE SAME, AND DISPLAY DEVICE

(71) Applicants: BOE TECHNOLOGY CO., LTD., Beijing (CN); HEFEI XINSHENG OPTOELECTRONICS TECHNOLOGY CO., LTD., Hefei, Anhui (CN)

(72) Inventor: Liping Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/082,932

(22) Filed: Mar. 28, 2016

(65) Prior Publication Data

US 2016/0372491 A1 Dec. 22, 2016

(30) Foreign Application Priority Data

Jun. 19, 2015 (CN) .......................... 2015 1 0345201

(51) Int. Cl.
| | |
|---|---|
| *H01L 27/24* | (2006.01) |
| *H01L 27/12* | (2006.01) |
| *H01L 29/423* | (2006.01) |
| *G02B 5/22* | (2006.01) |

(52) U.S. Cl.
CPC ............... *H01L 27/124* (2013.01); *G02B 5/22* (2013.01); *H01L 27/1259* (2013.01); *H01L 29/42356* (2013.01)

(58) Field of Classification Search
CPC ............... H01L 27/1214; H01L 27/124; H01L 27/1244; H01L 27/1259; H01L 29/42356; G02B 5/22
See application file for complete search history.

(56) References Cited

U.S. PATENT DOCUMENTS

2009/0206343 A1* 8/2009 Choi ..................... H01L 27/124
257/72

\* cited by examiner

*Primary Examiner* — Daniel Shook
(74) *Attorney, Agent, or Firm* — Kinney & Lange, P.A.

(57) ABSTRACT

The invention discloses an array substrate, a display panel and methods of manufacturing the same, and a display device. The array substrate comprises: a pixel region and a wiring region located outside the wiring region; a gate line and a data line each arranged within both the pixel and wiring regions; a passivation layer arranged to cover the gate and data lines and provided therein with trenches respectively exposing and being wider than the gate and data lines within the wiring region; first and second signal line partially arranged within the trenches respectively and contacting exposed portions of the gate and data lines to transmit signals to the gate and gate lines respectively, the first and second signal line each having widths equal to those of the trenches respectively. With the invention, good electrical connections between the signal line and the gate and data lines are enabled.

20 Claims, 4 Drawing Sheets

ARRAY SUBSTRATE AND METHOD OF MANUFACTURING THE SAME, DISPLAY PANEL AND METHOD OF MANUFACTURING THE SAME, AND DISPLAY DEVICE

CROSS-REFERENCE TO RELATED APPLICATION

This application claims the benefit of the Chinese Patent Application No. 201510345201.X filed on Jun. 19, 2015 in the State Intellectual Property Office of China, the whole disclosure of which is incorporated herein by reference.

BACKGROUND OF THE INVENTION

Field of the Invention

Embodiments of the present disclosure generally relate to the field of display technologies, and particularly, to an array substrate and a method of manufacturing the same, a display panel and a method of manufacturing the same, and a display device.

Description of the Related Art

Generally, a signal line is connected onto an array substrate in the following way of: forming a via hole in an insulation layer covering a metal lines (for example, a gate line or a data line) extending from a display region or a pixel region, such that a contact portion of the metal line is exposed, then connecting the signal line (for example, ITO) with the contact portion, such that a signal is transmitted through the signal line to the metal line of the array substrate exposed from the via hole in a wiring region, and then transmitted to the display region to form a display image.

The insulation layer covering the metal line is generally made of a non-metal material, and the via hole in the non-metal material has a depth of about 4,000~10,000 angstroms. Breakage in the signal line will easily occur at an edge of the hole when the via hole has a larger depth. As shown in FIG. 1, a signal line is connected to a data line through a via hole in a passivation layer, and breakage will easily occur at portions indicated by the arrows; as shown in FIG. 2, a signal line is connected to a gate line through a via hole in a passivation layer and a via hole in a gate insulation layer, and breakage will easily occur at locations indicated by the arrows, which may lead to a failure in signal transmission from the signal line to the gate line and the data line, causing abnormal lighting of the pixel region. In addition, since the via hole is formed smaller at a connection between the signal line and the gate line or the data line, it is difficult for moisture generated in cutting process to completely volatilize, and oxidation of metals and electrical corrosion will easily occur under a certain temperature in the production line.

SUMMARY

At least one technique problem to be solved by the present disclosure is how to avoid breakage at connection between signal lines and gate lines and data lines so as to ensure a good electrical connection between the signal lines and the gate lines and data lines.

According to one aspect of the present disclosure, there is provided an array substrate, comprising:

a pixel region and a wiring region, the pixel region being arranged inside the wiring region;

a gate line arranged within the pixel region and the wiring region and comprising a first portion extending over a first length within the wiring region;

a data line arranged within the pixel region and the wiring region and comprising a second portion extending over a second length within the wiring region;

a passivation layer provided within the pixel region and the wiring region and covering the gate line and the data line, a portion of the passivation layer within the wiring region being provided therein with a first trench, from which at least the first portion of the gate line is exposed and which has a width larger than a width of the first portion of the gate line, and/or a portion of the passivation layer within the wiring region being provided therein with a second trench, from which at least the second portion of the data line is exposed and which has a width larger than a width of the second portion of the data line;

a first signal line partially arranged within the first trench, and covering and contacting the portion of the gate line exposed from first trench so as to transmit a first signal to the gate line, a portion of the first signal line arranged within the first trench having a width equal to the width of the first trench; and a second signal line, partially arranged within the second trench, and covering and contacting the portion of the data line exposed from second trench so as to transmit a second signal to the data line, a portion of the second signal line arranged within the second trench having a width equal to the width of the second trench.

Preferably, an end of the portion of the gate line extending into the wiring region and/or an end of the portion of the data line extending into the wiring region is located inside an outer edge of the wiring region.

Preferably, the first signal line completely covers and directly contacts the first portion of a corresponding gate line within the wiring region, and is electrically insulated from adjacent gate lines; and/or the second signal line completely covers and directly contacts the second portion of a corresponding data line within the wiring region, and is electrically insulated from adjacent data lines.

Preferably, the array substrate further comprises:

a base substrate, on which the gate line is arranged; and a gate insulation layer arranged on the gate line, wherein the data line is arranged on the gate insulation layer.

Preferably, the sum of a thickness of the gate line and a thickness of the first signal line is equal to the sum of a thickness of the passivation layer and a thickness of the gate insulation layer, and/or the sum of a thickness of the data line and the thickness of the second signal line is equal to the thickness of the passivation layer.

According to another aspect of the present disclosure, there is further provided a display panel, comprising the array substrate as described above, and further comprising:

a color filter substrate assembled together with the array substrate, wherein a region between a boundary of the color filter substrate and a boundary of the array substrate is the wiring region.

Preferably, the array substrate further comprises:

a reserved region arranged inside the wiring region and outside the pixel region, wherein the reserved region is located between the boundary of the color filter substrate and a boundary of the pixel region.

Preferably, a portion of the first trench extends into the reserved region and has an end located outside the pixel region, and/or a portion of the second trench extends into the reserved region and has an end located outside the pixel region.

According to a further aspect of the present disclosure, there is provided a display device comprising the display panel as described above.

According to a still further aspect of the present disclosure, there is provided method of manufacturing an array substrate, the array substrate comprising a pixel region and a wiring region located outside the pixel region, the method comprising:

forming a gate line and a data line within the pixel region and the wiring region, wherein the gate line comprises a first portion extending over a first length within the wiring region, and the data line comprises a second portion extending over a second length within the wiring region;

forming a passivation layer within the pixel region and the wiring region to cover the gate line and the data line;

etching the passivation layer to form a first trench in the passivation layer, at least the first portion of the gate line being exposed from the first trench and the first trench having a width larger than a width of the first portion of the gate line, and/or to form a second trench in the passivation layer, at least the second portion of the data line being exposed from the second trench and the second trench having a width larger than a width of the second portion of the data line;

forming a first signal line, such that the first signal line is partially located within the first trench, and covers and contacts the first portion of the gate line so as to transmit a first signal to the gate line, a portion of the first signal line located within the first trench having a width equal to the width of the first trench;

forming a second signal line, such that the first signal line is partially located within the second trench, and covers and contacts the second portion of the data line so as to transmit a second signal to the data line, a portion of the second signal line located within the second trench having a width equal to the width of the second trench.

Preferably, forming a gate line and a data line comprises:
forming the gate line on a base substrate;
forming a gate insulation layer on the gate line; and
forming the data line on the gate insulation layer.

According to a still another aspect of the present disclosure, there is provided a method of manufacturing a display panel, comprising the method of manufacturing the array substrate as described above, and further comprising:

assembling the color filter substrate to the formed array substrate;

cutting the assembled substrates such that a boundary of the color filter substrate is spaced apart from a boundary of the array substrate by a first distance and that the wiring region is formed between the boundary of the color filter substrate and the boundary of the array substrate.

Preferably, cutting the assembled substrates further comprises: spacing the boundary of the color filter substrate apart from a boundary of the pixel region by a second distance such that a reserved region is formed between the boundary of the color filter substrate and the boundary of the pixel region.

Preferably, etching the passivation layer further comprises:

forming the first trench in the passivation layer to expose portions of the gate line located within the wiring region and the reserved region, the first trench extending through a third length within the reserved region without extending into the pixel region; and/or forming the second trench in the passivation layer to expose portions of the data line located within the wiring region and the reserved region, the second trench extending through a fourth length within the reserved region without extending into the pixel region.

With the above technique solutions, trenches are provided in the passivation layer over the gate line and the data line, such that the first signal line completely covers the portion of the gate line within the wiring region, and the second signal line completely covers the portion of the data line within the wiring region, thereby it can ensure a good electrical connection between the first signal line and the gate line, and a good electrical connection between the second signal line and the data line, and can avoid unsatisfactory signal transmission due to breakage of the first signal line at its connection with the gate line or breakage of the second signal line at its connection with the data line.

BRIEF DESCRIPTION OF THE DRAWINGS

Features and advantages of the present invention will become more apparent when referring to the accompanying drawings, which are schematic and should not be interpreted as being limitative to the present invention, and in which.

Figure 1:
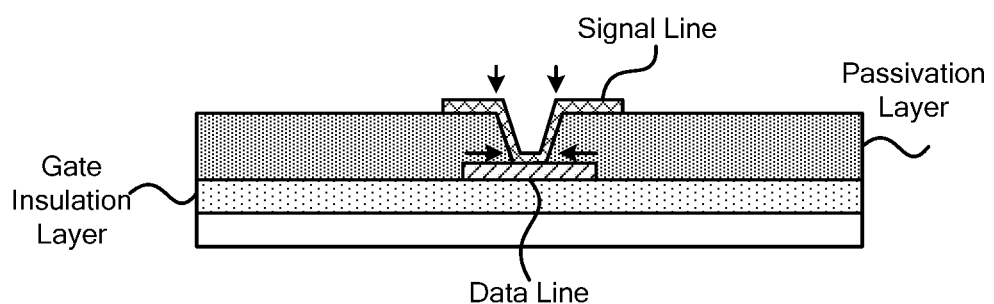
FIG. 1 is a schematic drawing showing a connection between a signal line and a data line in prior arts.
Figure 2:
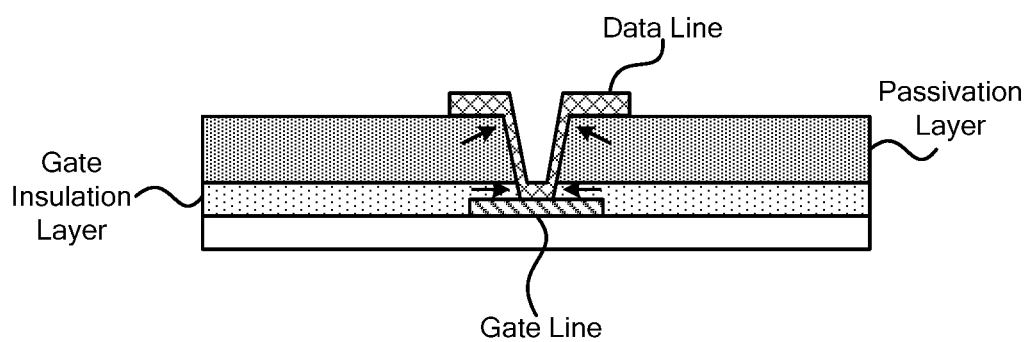
FIG. 2 is a schematic drawing showing a connection between a signal line and a gate line in prior arts.

LIST OF REFERENCE NUMERALS 1-gate line; 2-data line; 3-passivation layer; 4-first signal line; 5-second signal line; 6-base substrate; 7-gate insulation layer; 10-pixel region; 20-wiring region; 30-reserved region.

DETAINED DESCRIPTION OF PREFERRED
EMBODIMENTS OF THE INVENTION

In order to make clearer understanding of the above objects, features and advantages of the present disclosure, the present invention will be described hereinafter in detail with reference to exemplary embodiments and attached drawings. It is noted that in case of no conflict, the embodiments of the present disclosure and features thereof may be combined.

In the following detailed description, for purposes of explanation, numerous specific details are set forth in order to provide a thorough understanding of the disclosed embodiments. It will be apparent, however, the present invention may be embodied in many different forms and should not be construed as being limited to the embodiment set forth herein; rather, these embodiments are provided so that the present invention will be thorough and complete, and will fully convey the concept of the disclosure to those skilled in the art.

Figure 3:
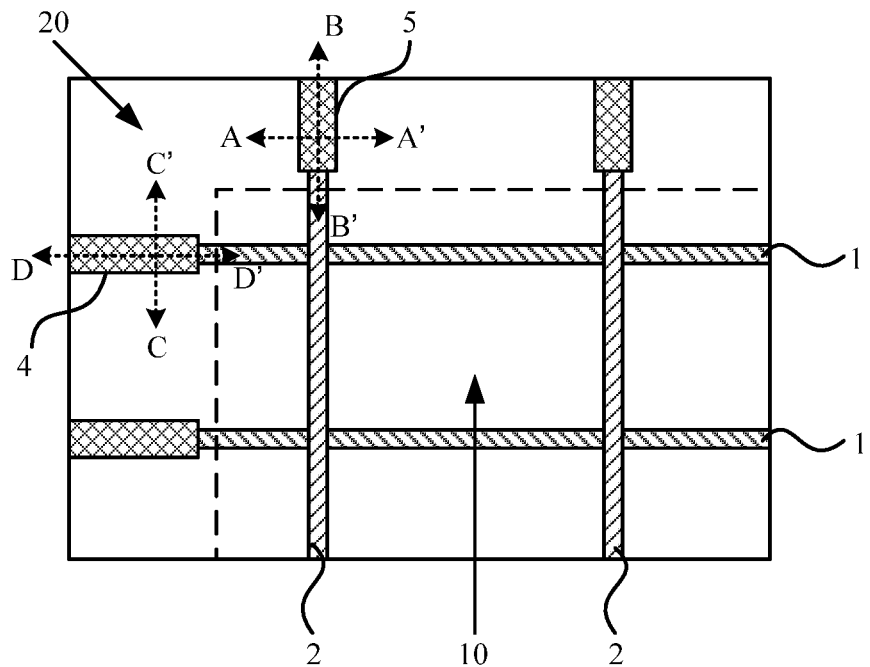
FIG. 3 is a schematic structural drawing showing an array substrate according to an embodiment of the present disclosure.
Figure 4:
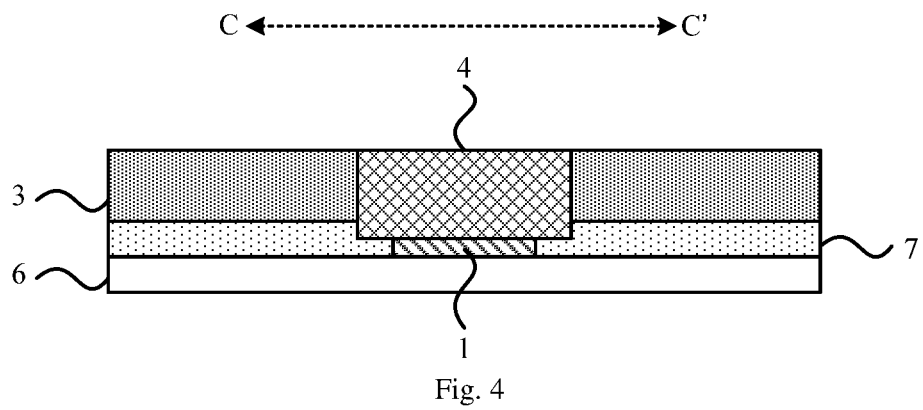
FIG. 4 is a schematic sectional drawing of the array substrate shown in FIG. 3, taken along a line C-C'.
Figure 5:
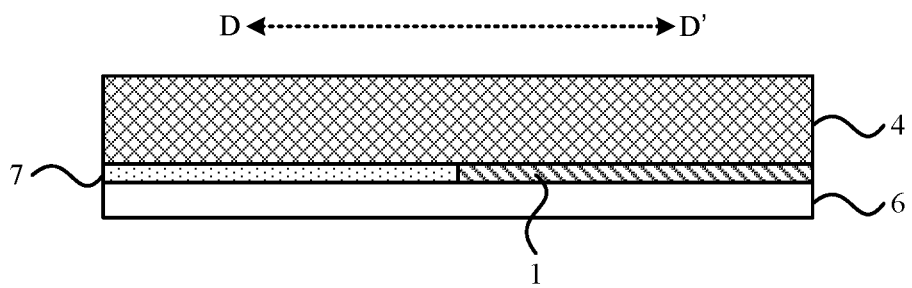
FIG. 5 is a schematic sectional drawing of the array substrate shown in FIG. 3, taken along a line D-D'.
Figure 6:
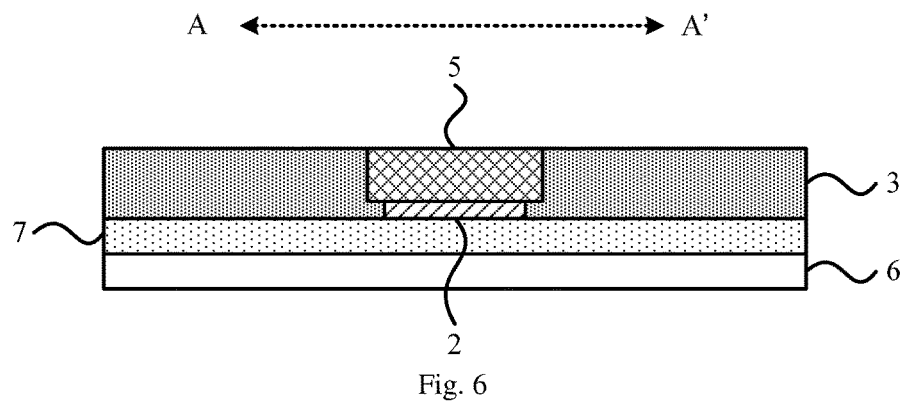
FIG. 6 is a schematic sectional drawing of the array substrate shown in FIG. 3, taken along a line A-A'.
Figure 7:
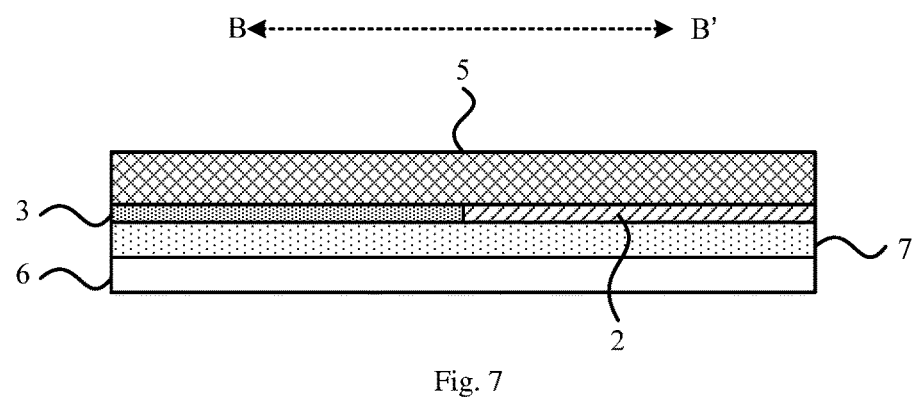
FIG. 7 is a schematic sectional drawing of the array substrate shown in FIG. 3, taken along a line B-B'.

An array substrate according to an embodiment of the present disclosure, as shown in FIG. 3, comprises: a pixel region 10 (that is, a region surrounded by dashed lines) and a wiring region 20 arranged outside the pixel region 10;

a gate line 1 arranged within the pixel region 10 and the wiring region 20 and comprising a first portion located within the wiring region 20, the first portion extending over a first length within the wiring region 20;

a data line 2 arranged within the pixel region 10 and the wiring region 20 and comprising a second portion located within the wiring region 20, the second portion extending over a second length within the wiring region 20;

a passivation layer 3 (see FIGS. 4. 6 and 7) provided within the pixel region 10 and the wiring region 20 and covering the gate line 1 and the data line 2, a portion of the passivation layer 3 within the wiring region 20 being provided therein with a first trench, from which at least the first portion of the gate line 1 is exposed and which has a width larger than a width of the first portion of the gate line 1, and/or a portion of the passivation layer 3 within the wiring region being provided therein with a second trench, from which at least the second portion of the data line 2 is exposed and which has a width larger than a width of the second portion of the data line 2;

a first signal line 4 partially arranged within the first trench and covering and contacting the portion of the gate line 1 exposed from first trench so as to transmit a first signal to the gate line 1, as shown in FIG. 4, a portion of the first signal line 4 arranged within the first trench having a width equal to the width of the first trench; and a second signal line 5 partially arranged within the second trench and covering and contacting the portion of the data line exposed from second trench so as to transmit a second signal to the data line 2, as shown in FIG. 6, a portion of the second signal line 5 arranged within the second trench having a width equal to the width of the second trench.

Since the width of the first signal line 4 is equal to that of the first trench, and the width of the first trench is larger than that of the first portion of the gate line 1, the width of the first signal line 4 is larger than that of the first portion of the gate line 1, such that the first signal line 4 may completely cover the portion of the gate line 1 within the wiring region 20, and correspondingly, the second signal line 5 may completely cover the portion of the data line 2 within the wiring region 20, such that the signal lines have large contact areas with the gate line 1 and the data line 2 within the wiring region, and no bad electrical connection will occur due to breakage of connection in some regions. Thus, good electrical connections can be established between the signal lines and the gate line 1 and the data line 2, such that signals from the signal lines can be successfully transmitted to the gate line 1 and the data line 2 so as to control the pixel region 20.

Further, since the width of the first trench is larger than that of the first portion of the gate line 1, and the width of the second trench is larger than that of the second portion of the data line 2, cross sectional areas of the trenches are much larger than those of via holes in the passivation layer 3 in prior arts. Thus, it can ensure a complete volatilization of the moisture generated in cutting process, and oxidation or electrical corrosion of the signal line, the gate line 1 or the data line 2 in the trenches can be avoided, so that good electrical performance of product can be ensured. Further, since the first signal line 4 completely covers the portion of the gate line 1 within the wiring region 20 and the width of the first signal line 4 is larger than that of the portion of the gate line 1 within the wiring region 20, the first signal line 4 can cover a gap between the portion of the gate line 1 within the wiring region 20 and a gate insulation layer 7, as shown in FIG. 4, so as to prevent corrosion of the gate line 1 caused by penetration of oxygen or moisture into the gap in subsequent processes. Similarly, the second signal line 5 can completely cover a gap between the portion of the data line 2 within the wiring region 20 and the passivation layer 3, as shown in FIG. 6, so as to prevent corrosion of the data line 2 caused by penetration of oxygen or moisture into the gap in subsequent processes.

As shown in FIGS. 3. 5 and 7, preferably, an end of the portion of the gate line 1 extending into the wiring region 20 and an end of the portion of the data line 2 extending into the wiring region 20 are located within the wiring region 20, that is, the ends are located inside an outer edge of the wiring region 20 or does not go beyond the outer edge of the wiring region 20; in other words, the gate line 1 and the data line 2 are ended in the wiring region 20.

It is known that each array substrate is obtained by cutting a mother board, and a cutting line, along which the mother board is cut into respective array substrates, is located at the outer edge of the wiring region 20. Thus, if the gate line 1 and the data line 2 are arranged at or near the outer edge of the wiring region 20, a cutting operation will generate uneven portions (for example, burrs) at ends of the gate line 1 and the data line 2 being cut when cutting the mother board along the cutting line, which results in a non-uniform distribution of resistance of the gate line 1 and the data line 2 and unevenness at a connection portion between the first signal line 4 and the gate line 1 and a connection portion between the second signal line 5 and the data line 2, such that poor contact may occur easily.

In embodiments of the present disclosure, with the ends of the portions of the gate line 1 and the data line 2 extending into the wiring region 20 being located within the wiring region 20, it can be ensured that the gate line 1 and the data line 2 of the array substrate will not be cut when cutting and dividing the mother board, and that surfaces of the gate line 1 and the data line 2 within the wiring region 20 are even, thereby good electrical connections between the first signal line 4 and the gate line 1 and between the second signal line 5 and the data line 2 can be achieved.

It is noted that, the lengths at which the gate line 1 and the data line 2 extend within the wiring region are equal to or different from each other, and may be particularly set according to requirements of connection.

Preferably, the first signal line 4 completely covers and directly contacts the portion of the gate line 1 within the wiring region, and is electrically insulated from adjacent gate lines; and/or the second signal line 5 completely covers and directly contacts the portion of the data line 2 within the wiring region, and is electrically insulated from adjacent data lines.

Preferably, the array substrate according to embodiments of the present disclosure further comprises: a base substrate 6, on which the gate line 1 is arranged; and a gate insulation layer 7 arranged on the gate line 1, wherein the data line 2 is arranged on the gate insulation layer 7.

Preferably, the sum of a thickness of the gate line 1 and a thickness of the first signal line 4 is equal to the sum of a thickness of the passivation layer 3 and a thickness of the gate insulation layer 7, and/or the sum of a thickness of the data line 2 and a thickness of the second signal line 5 is equal to the thickness of the passivation layer 3.

With such a configuration, it can be ensured that upper surfaces of the first signal line 4 and the second signal line 5 are located within the same plane as an upper surface of the passivation layer 3, so as to provide a basis of evenness for subsequent processes.

Figure 8:
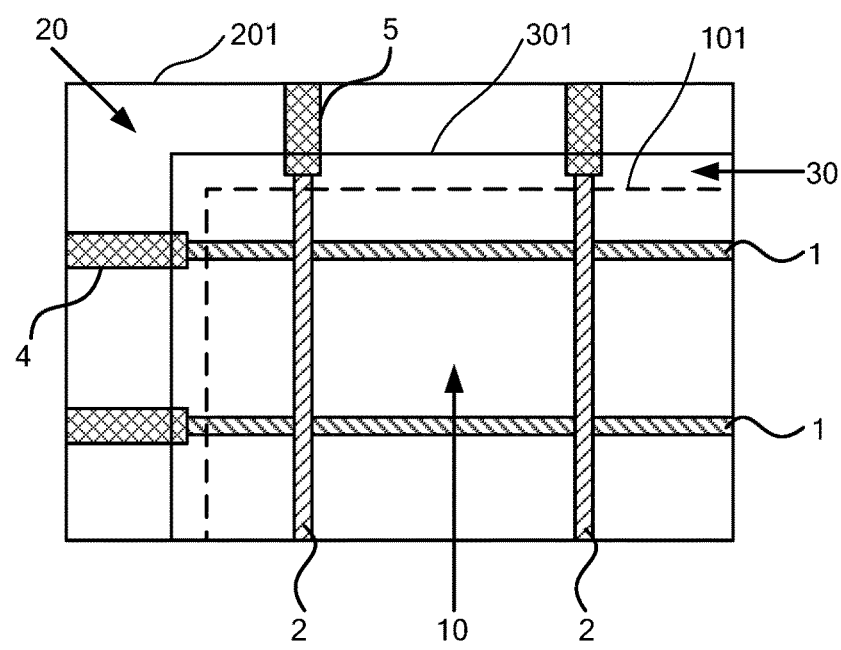
FIG. 8 is a schematic structural drawing showing a display panel according to an embodiment of the present disclosure.

Embodiments of the present disclosure further provide a display panel, comprising:

the array substrate according to any one of the above embodiments; and a color filter substrate assembled together with the array substrate, wherein a region between a boundary 301 of the color filter substrate and a boundary 201 of the array substrate is the wiring region 20, as shown in FIG. 8.

Preferably, the array substrate further comprises a reserved region 30 arranged inside the wiring region 20 and outside the pixel region 10, as shown in FIG. 8, wherein the reserved region 30 is located between the boundary 301 of the color filter substrate and a boundary 101 of the pixel region 10.

After assembling the color filter substrate to the array substrate, it is required to cut edges of the color filter substrate to form the wiring region 20 in portions of the array substrate outside the color filter substrate, so as to be assembled and connected with other modules (for example, a printed circuit board).

With the reserved region 30 being provided between the pixel region 10 and the wiring region 20, damage to the pixel region 10 can be prevented when cutting the color filter substrate and the resulted display panel has a good display effect.

Preferably, a portion of the first trench extends into the reserved region 30 and does not extend into the pixel region 10, and/or a portion of the second trench extends into the reserved region 30 and does not extend into outside the pixel region 10.

Since the first signal line 4 is arranged within the first trench and can cover the portion of the gate line 1 within reserved region 30 and the second signal line 5 is arranged within the second trench and can cover the portion of the data line 2 within reserved region 30, in case of an overcutting during cutting the color filter substrate, the rigid first signal line 4 and/or second signal line 5 may be firstly partially damaged, but the gate line 1 and the data line 2 will not be firstly damaged. The first signal line 4 and the gate line 1 contact the second signal line 5 and the data line 2 at the cutting line of the color filter substrate and at other positions such as the wiring region 20, thus the electrical connection between the first signal line 4 and the gate line 1 and the electrical connection between the second signal line 5 and data line will not be affected when the first signal line 4 and the second signal line 5 are cut at the cutting line of the color filter substrate. Thereby, damages to the gate line 1 under the first signal line 4 and to the data line 2 under the second signal line 5 can be reduced when cutting the color filter substrate, so that good signal transmission on the gate line 1 and the data line 2 can be ensured.

Embodiments of the present disclosure further provide a display device, comprising the display panel according to any one of the above described embodiments.

It is noted that, the display device in the embodiments of the present disclosure may be an electronic paper, a mobile phone, a tablet computer, a TV set, a notebook PC, a digital picture frame, a navigator or any other products or components having a display function.

Figure 9:
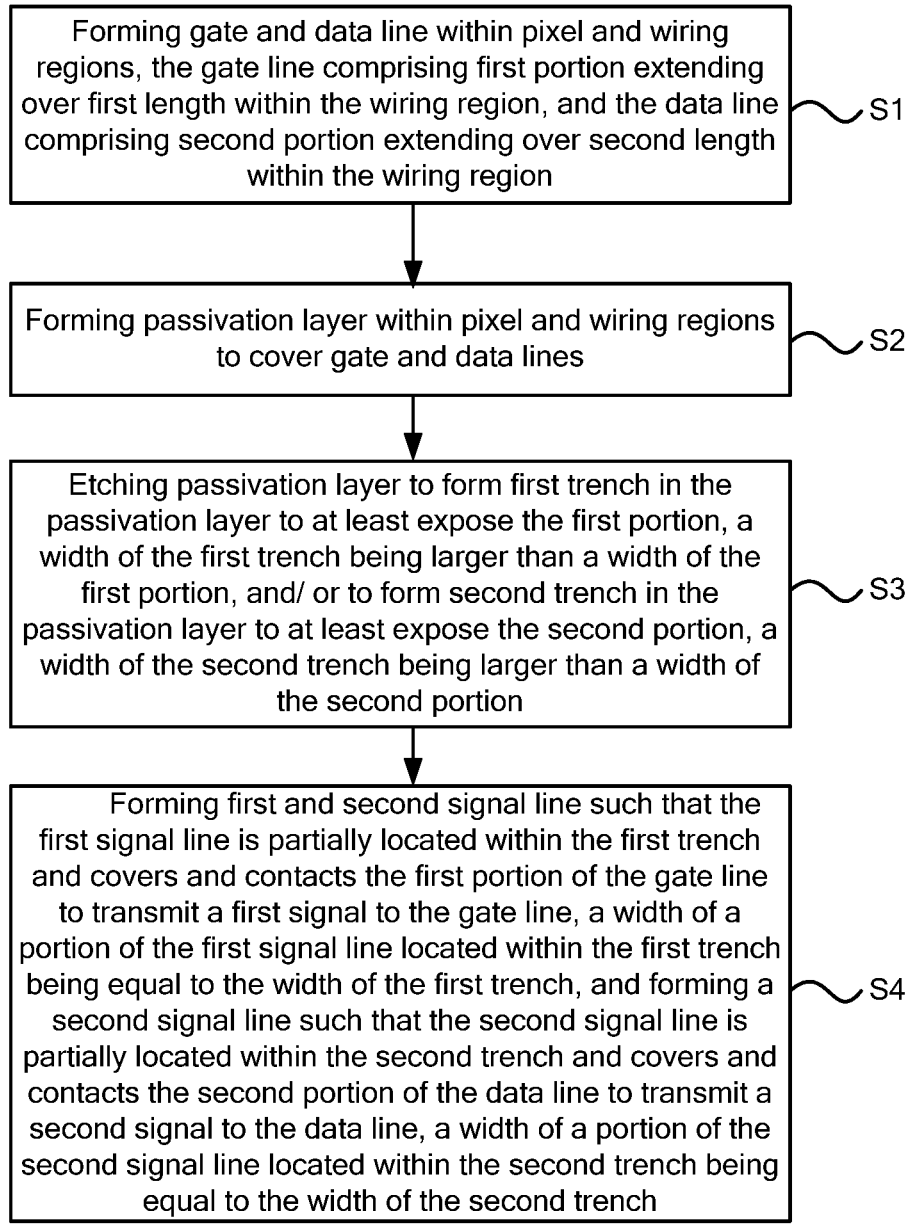
FIG. 9 is a schematic flowchart showing a method of manufacturing an array substrate according to an embodiment of the present disclosure.

Embodiments of the present disclosure further provide a method of manufacturing an array substrate, as shown in FIG. 9, the array substrate comprises a pixel region 10 and a wiring region 20 located outside the pixel region, and the method comprises the following steps of:

S1: forming a gate line 1 and a data line 2 within the pixel region 10 and the wiring region 20, wherein the gate line 1 comprises a first portion located within the wiring region 20 and extending over a first length within the wiring region 20, and the data line 2 comprises a second portion located within the wiring region 20 and extending over a second length within the wiring region 20;

S2: forming a passivation layer 3 within the pixel region 10 and the wiring region 20 to cover the gate line 1 and the data line 2;

S3: etching the passivation layer 3 to form a first trench in a portion of the passivation layer 3 within the wiring region 20, the first portion of the gate line 1 being exposed from the first trench and the first trench having a width larger than a width of the first portion of the gate line 1, and/or to form a second trench in a portion of the passivation layer 3 within the wiring region 20, the second portion of the data line 2 being exposed from the second trench and the second trench having a width larger than a width of the second portion of the data line 2; and S4: forming a first signal line 4 such that the first signal line 4 is partially located within the first trench and covers and contacts the first portion of the gate line 1 to transmit a first signal to the gate line 1, a width of a portion of the first signal line 4 located within the first trench being equal to the width of the first trench, and forming a second signal line 5 such that the second signal line is partially located within the second trench and covers and contacts the second portion of the data line 2 to transmit a second signal to the data line 2, a width of a portion of the second signal line located within the second trench being equal to the width of the second trench.

Preferably, the step of forming the gate line 1 and the data line 2 comprises:

forming the gate line 1 on a base substrate 6;

forming a gate insulation layer 7 on the gate line 1; and forming the data line 2 on the gate insulation layer 7.

Embodiments of the present disclosure further provide a method of manufacturing a display panel, comprising the method of manufacturing the array substrate as described above, and further comprising:

assembling the color filter substrate to the array substrate having been formed;

cutting the assembled substrates such that a boundary of the color filter substrate is spaced apart from a boundary of the array substrate by a first distance, wherein a region between the boundary of the color filter substrate and the boundary of the array substrate is the wiring region 20.

Preferably, cutting the assembled substrates further comprises spacing the boundary of the color filter substrate apart from a boundary of the pixel region 10 by a second distance, wherein a region between the boundary of the color filter substrate and the boundary of the pixel region 10 is the reserved region 30.

Preferably, etching the passivation layer 3 further comprises: forming the first trench in the passivation layer 3 to expose a portion of the gate line 1 located within the wiring region 20 and the reserved region 30, the first trench extending over a third length within the reserved region 30 without extending into the pixel region 10; and/or forming the second trench in the passivation layer 3 to expose a portion of the data line 2 located within the wiring region 20 and the reserved region 30, the second trench extending over a fourth length within the reserved region 30 and not extending into the pixel region 10.

In an example, the forming steps in the above manufacturing processes may include, for example, film forming processes such as deposition, sputtering and the like, and patterning processes such as etching and the like.

It is noted that, in the drawings, sizes of layers and regions may be magnified for a clear illustration. Further, it will be understood that, when an element or layer is located "on" another element or layer, it may be directly on the another element or layer, or there may be an intermediate element or layer therebetween. Similarly, it will also be understood that, when an element or layer is located "under" another element or layer, it may be directly under the another element or layer, or there may be one or more intermediate element or layer therebetween. In addition, it will be appreciated that, when a layer or element is located "between" two layers or elements, it may be the only layer or element between the two layers or elements, or there may be more than one or more other intermediate elements or layers. Similar reference numerals indicate similar elements throughout the document.

In the present disclosure, terms "first", "second", "third" and the like are only intended for description purpose, but could not be understood as indicating or implying relative importance. Term "a plurality of" refers to two or more, unless otherwise expressly defined.

The above described contents are only preferred embodiments of the present disclosure, and are not intended to limit the present disclosure. Various modification and changes may be made to the present disclosure by those skilled in the art. All changes, alternatives or modifications which are made within the principles and spirit of the present disclosure should fall within the scopes of the present invention.

What is claimed is:

1. An array substrate, comprising:
   a pixel region and a wiring region, the pixel region being arranged inside the wiring region;
   a gate line arranged within the pixel region and the wiring region and comprising a first portion extending over a first length within the wiring region;
   a data line arranged within the pixel region and the wiring region and comprising a second portion extending over a second length within the wiring region;
   a passivation layer provided within the pixel region and the wiring region and covering the gate line and the data line, a portion of the passivation layer within the wiring region being provided therein with a first trench, from which at least the first portion of the gate line is exposed and which has a width larger than a width of the first portion of the gate line, and/or a portion of the passivation layer within the wiring region being provided therein with a second trench, from which at least the second portion of the data line is exposed and which has a width larger than a width of the second portion of the data line;
   a first signal line partially arranged within the first trench and covering and contacting the portion of the gate line exposed from first trench so as to transmit a first signal to the gate line, a portion of the first signal line arranged within the first trench having a width equal to the width of the first trench; and
   a second signal line, partially arranged within the second trench and covering and contacting the portion of the data line exposed from second trench so as to transmit a second signal to the data line, a portion of the second signal line arranged within the second trench having a width equal to the width of the second trench.

2. The array substrate according to claim 1, wherein an end of the portion of the gate line extending into the wiring region and/or an end of the portion of the data line extending into the wiring region is located inside an outer edge of the wiring region.

3. The array substrate according to claim 2, further comprising:
   a base substrate, on which the gate line is arranged; and
   a gate insulation layer arranged on the gate line, wherein the data line is arranged on the gate insulation layer.

4. The array substrate according to claim 3, wherein
   the sum of a thickness of the gate line and a thickness of the first signal line is equal to the sum of a thickness of the passivation layer and a thickness of the gate insulation layer, and/or
   the sum of a thickness of the data line and a thickness of the second signal line is equal to the thickness of the passivation layer.

5. The array substrate according to claim 1, wherein
   the first signal line completely covers and directly contacts the first portion of a corresponding gate line within the wiring region, and is electrically insulated from adjacent gate lines; and/or
   the second signal line completely covers and directly contacts the second portion of a corresponding data line within the wiring region, and is electrically insulated from adjacent data lines.

6. The array substrate according to claim 5, further comprising:
   a base substrate, on which the gate line is arranged; and
   a gate insulation layer arranged on the gate line, wherein the data line is arranged on the gate insulation layer.

7. The array substrate according to claim 6, wherein
   the sum of a thickness of the gate line and a thickness of the first signal line is equal to the sum of a thickness of the passivation layer and a thickness of the gate insulation layer, and/or
   the sum of a thickness of the data line and a thickness of the second signal line is equal to the thickness of the passivation layer.

8. The array substrate according to claim 1, further comprising:
   a base substrate, on which the gate line is arranged; and
   a gate insulation layer arranged on the gate line, wherein the data line is arranged on the gate insulation layer.

9. The array substrate according to claim 8, wherein
   the sum of a thickness of the gate line and a thickness of the first signal line is equal to the sum of a thickness of the passivation layer and a thickness of the gate insulation layer, and/or
   the sum of a thickness of the data line and a thickness of the second signal line is equal to the thickness of the passivation layer.

10. A display panel comprising the array substrate according to claim 1, the display panel further comprising:
    a color filter substrate assembled together with the array substrate, wherein a region between a boundary of the color filter substrate and a boundary of the array substrate is the wiring region.

11. The display panel according to claim 10, wherein the array substrate further comprises:
a reserved region arranged inside the wiring region and outside the pixel region,
wherein the reserved region is located between the boundary of the color filter substrate and a boundary of the pixel region.

12. The display panel according to claim 11, wherein
a portion of the first trench extends into the reserved region and does not extend into the pixel region, and/or
a portion of the second trench extends into the reserved region and does not extend into the pixel region.

13. The display panel according to claim 10, wherein an end of the portion of the gate line extending into the wiring region and/or an end of the portion of the data line extending into the wiring region is located inside an outer edge of the wiring region.

14. The display panel according to claim 10, wherein
the sum of a thickness of the gate line and a thickness of the first signal line is equal to the sum of a thickness of the passivation layer and a thickness of the gate insulation layer, and/or
the sum of a thickness of the data line and a thickness of the second signal line is equal to the thickness of the passivation layer.

15. A display device, comprising the display panel according to claim 10.

16. A method of manufacturing an array substrate, the array substrate comprising a pixel region and a wiring region located outside the pixel region, the method comprising:
forming a gate line and a data line within the pixel region and the wiring region, wherein the gate line comprises a first portion extending over a first length within the wiring region, and the data line comprises a second portion extending over a second length within the wiring region;
forming a passivation layer within the pixel region and the wiring region to cover the gate line and the data line;
etching the passivation layer to form a first trench in the passivation layer, at least the first portion of the gate line being exposed from the first trench and the first trench having a width larger than a width of the first portion of the gate line, and/or to form a second trench in the passivation layer, at least the second portion of the data line being exposed from the second trench and the second trench having a width larger than a width of the second portion of the data line;
forming a first signal line, such that the first signal line is partially located within the first trench and covers and contacts the first portion of the gate line to transmit a first signal to the gate line, a width of a portion of the first signal line located within the first trench being equal to the width of the first trench; and
forming a second signal line, such that the second signal line is partially located within the second trench and covers and contacts the second portion of the data line to transmit a second signal to the data line, a width of a portion of the second signal line located within the second trench being equal to the width of the second trench.

17. The method according to claim 16, wherein forming a gate line and a data line comprises:
forming the gate line on a base substrate;
forming a gate insulation layer on the gate line; and
forming the data line on the gate insulation layer.

18. A method of manufacturing a display panel, comprising the method of manufacturing the array substrate according to claim 16, and further comprising:
assembling the color filter substrate to the array substrate having been formed;
cutting the assembled substrates such that a boundary of the color filter substrate is spaced apart from a boundary of the array substrate by a first distance and that the wiring region is formed between the boundary of the color filter substrate and the boundary of the array substrate.

19. The method according to claim 18, wherein cutting the assembled substrates further comprises:
spacing the boundary of the color filter substrate apart from a boundary of the pixel region by a second distance such that a reserved region is formed between the boundary of the color filter substrate and the boundary of the pixel region.

20. The method according to claim 19, wherein etching the passivation layer further comprises:
forming the first trench in the passivation layer to expose a portion of the gate line located within the wiring region and the reserved region, the first trench extending over a third length within the reserved region without extending into the pixel region; and/or
forming the second trench in the passivation layer to expose portions of the data line located within the wiring region and the reserved region, the second trench extending over a fourth length within the reserved region without extending into the pixel region.

* * * * *